United States Patent
Wang

(10) Patent No.: US 11,933,863 B2
(45) Date of Patent: Mar. 19, 2024

(54) METHOD FOR MEASURING SHORTEST DISTANCE BETWEEN CAPACITANCES AND METHOD FOR EVALUATING CAPACITANCE MANUFACTURE PROCEDURE

(71) Applicant: CHANGXIN MEMORY TECHNOLOGIES, INC., Hefei (CN)

(72) Inventor: Weigang Wang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 345 days.

(21) Appl. No.: 17/392,411

(22) Filed: Aug. 3, 2021

(65) Prior Publication Data
US 2022/0026504 A1    Jan. 27, 2022

Related U.S. Application Data

(63) Continuation of application No. PCT/CN2021/099828, filed on Jun. 11, 2021.

(30) Foreign Application Priority Data

Jul. 27, 2020    (CN) .......................... 202010729801.7

(51) Int. Cl.
*G01B 7/14*    (2006.01)
*G01R 31/52*    (2020.01)

(52) U.S. Cl.
CPC ............... *G01R 31/52* (2020.01); *G01B 7/14* (2013.01)

(58) Field of Classification Search
CPC ............ G01R 31/52; G01B 7/14; H01L 22/12
See application file for complete search history.

(56) References Cited

U.S. PATENT DOCUMENTS

| 5,761,391 A | 6/1998 | Sato |
| 5,808,366 A | 9/1998 | Song |
| 2006/0043153 A1 | 3/2006 | Yamaoka |

(Continued)

FOREIGN PATENT DOCUMENTS

| CN | 2037059 U | 5/1989 |
| CN | 1601379 A | 3/2005 |

(Continued)

OTHER PUBLICATIONS

First Office Action of the Chinese application No. 202010729801.7, dated Jun. 7, 2022, 19 pgs.

(Continued)

*Primary Examiner* — Dominic E Hawkins
(74) *Attorney, Agent, or Firm* — Cooper Legal Group, LLC

(57) ABSTRACT

The application provides a method for measuring a shortest distance between capacitances and a method for evaluating a capacitance manufacture procedure. The method for measuring the shortest distance between the capacitances includes: obtaining a distance between tangent lines of adjacent surfaces of two adjacent capacitances, and taking the distance between the tangent lines of the adjacent surfaces of the two adjacent capacitances as the shortest distance between two capacitances. The tangent lines of the adjacent surfaces of the two adjacent capacitances have a same direction, and the direction of the tangent lines is perpendicular to a preset arrangement direction of the capacitances.

12 Claims, 6 Drawing Sheets

(56) References Cited

U.S. PATENT DOCUMENTS

| | | | |
|---|---|---|---|
| 2009/0026009 A1 | | 1/2009 | Itoh |
| 2012/0127111 A1* | | 5/2012 | Edwards .............. G06F 3/0416 |
| | | | 345/174 |
| 2013/0321000 A1 | | 12/2013 | Andarawis |
| 2019/0096581 A1* | | 3/2019 | Masoleh ................. H01G 4/30 |

FOREIGN PATENT DOCUMENTS

| | | | |
|---|---|---|---|
| CN | 1720458 A | | 1/2006 |
| CN | 1889252 A | | 1/2007 |
| CN | 101111937 A | | 1/2008 |
| CN | 101146983 A | | 3/2008 |
| CN | 101147299 A | | 3/2008 |
| CN | 101246872 A | | 8/2008 |
| CN | 101246872 A | * | 8/2008 |
| CN | 101675316 A | | 3/2010 |
| CN | 202660999 U | | 1/2013 |
| CN | 103543365 A | | 1/2014 |
| CN | 108957943 A | | 12/2018 |
| CN | 110378906 A | | 10/2019 |
| CN | 111238386 A | | 6/2020 |
| JP | S5987314 A | | 5/1984 |
| JP | H04370781 A | | 12/1992 |
| JP | 2001063421 A | | 3/2001 |
| JP | 2007087989 A | | 4/2007 |
| JP | 2010066021 A | | 3/2010 |
| JP | 2012064797 A | | 3/2012 |
| JP | 2019030930 A | | 2/2019 |
| SU | 1193455 A1 | | 11/1985 |
| TW | 201319693 A | | 5/2013 |
| WO | 2016183344 A1 | | 11/2016 |

OTHER PUBLICATIONS

International Search Report in the international application No. PCT/CN2021/099828, dated Aug. 26, 2021, 2 pgs.

* cited by examiner

METHOD FOR MEASURING SHORTEST DISTANCE BETWEEN CAPACITANCES AND METHOD FOR EVALUATING CAPACITANCE MANUFACTURE PROCEDURE

CROSS-REFERENCE TO RELATED APPLICATION

The present application is a continuation of International Application No. PCT/CN2021/099828, filed on Jun. 11, 2021, which is based upon and claims priority to Chinese Patent Application No. 202010729801.7, filed on Jul. 27, 2020 in China Patent Office and entitled "Method for Measuring Shortest Distance between Capacitances and Method for Evaluating Capacitance Manufacture Procedure". The contents of International Application No. PCT/CN2021/099828 and Chinese Patent Application No. 202010729801.7 are incorporated herein by reference in their entireties.

TECHNICAL FIELD

The disclosure relates to the field of memories, and in particular, to a method for measuring a shortest distance between capacitances and a method for evaluating a capacitance manufacture procedure.

BACKGROUND

With the decreasing of a feature size of a semiconductor integrated circuit device, the number of capacitances in a Dynamic Random Access Memory (DRAM) continues to increase. The possibility of short circuits occurred between adjacent capacitances becomes higher and higher. The short circuit occurred between adjacent capacitances is a very common cause of yield loss in a DRAM manufacturing process. Accurately measuring and monitoring the shortest distance between adjacent capacitances in a design direction are of great significance for manufacture procedure optimization and yield improvement.

A Critical Dimension Scanning Electron Microscope (CD SEM) is usually used to measure a horizontal distance between connected capacitances. However, due to randomness of a capacitance offset, this measurement method is not accurate.

SUMMARY

The technical problem to be solved by the embodiments of the disclosure is to provide a method for measuring a shortest distance between capacitances and a method for evaluating a capacitance manufacture procedure.

In order to solve the above-mentioned problem, the embodiments of the disclosure provide a method for measuring a shortest distance between capacitances. The method includes: obtaining a distance between tangent lines of adjacent surfaces of two adjacent capacitances, and taking the distance between the tangent lines of the adjacent surfaces of the two adjacent capacitances as the shortest distance between two capacitances. The tangent lines of the adjacent surfaces of the two adjacent capacitances have a same direction, and the direction of the tangent lines is perpendicular to a preset arrangement direction of the capacitances.

The embodiments of the disclosure further provide a method for evaluating a capacitance manufacture procedure. The method includes: obtaining a shortest distance between two capacitances and evaluating the capacitance manufacture procedure by comparing the shortest distance with a preset value. The shortest distance between the two capacitances is obtained by the above-mentioned method. The preset value is a distance between tangent lines when capacitances are arranged according to the preset arrangement direction.

The embodiments of the disclosure further provide a method for evaluating a capacitance manufacture procedure. The method includes the following steps: setting multiple sampling regions; obtaining multiple capacitance groups by obtaining multiple capacitances in each sampling region along a preset arrangement direction as one capacitance group; obtaining a difference between a maximum value and a minimum value of shortest distances between adjacent capacitances in one capacitance group as an initial parameter, herein the shortest distances between the adjacent capacitances in each capacitance group are obtained by the above-mentioned method for measuring a shortest distance between capacitances; and obtaining a mean value of the initial parameters of multiple capacitance groups, the mean value being used as a parameter for evaluating the capacitance manufacture procedure.

DETAILED DESCRIPTION

The following makes a detailed description to the embodiments of a method for measuring a shortest distance between capacitances and a method for evaluating a capacitance manufacture procedure provided by the embodiments of the disclosure in combination with the accompanying drawings.

Figure 1:
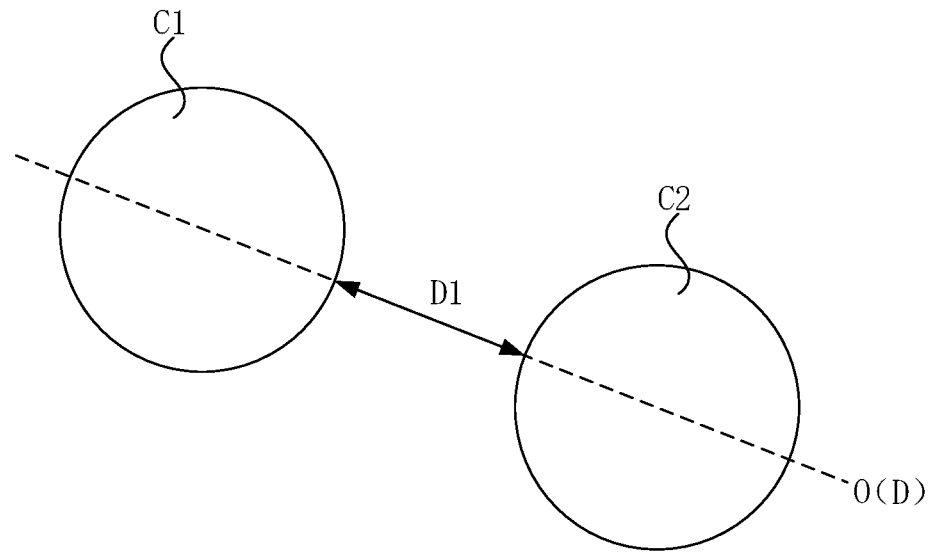
FIG. 1 is a schematic diagram of a method for measuring a shortest distance between adjacent capacitances in a preset arrangement direction in a related art.

A shortest distance between adjacent capacitances in a preset arrangement direction can effectively estimate a probability of a short circuit occurring between the capacitances, and the preset arrangement direction may be a theoretical arrangement direction of the capacitances. At the present, a method for measuring a shortest distance between adjacent capacitances in the theoretical arrangement direction is to measure a horizontal distance between connected capacitances by using a CD SEM. FIG. 1 is a schematic diagram of a method for measuring a shortest distance between adjacent capacitances in a theoretical arrangement direction in related art. Referring to FIG. 1, a capacitance C1 and a capacitance C2 are two adjacent capacitances, and a distance D1 between the capacitance C1 and the capacitance C2 in the theoretical arrangement direction (a direction D) is measured by the CD SEM. The distance D1 is the shortest distance between the capacitance C1 and the capacitance C2 in the theoretical arrangement direction to estimate a probability of a short circuit occurring between the capacitance C1 and the capacitance C2.

Figure 2:
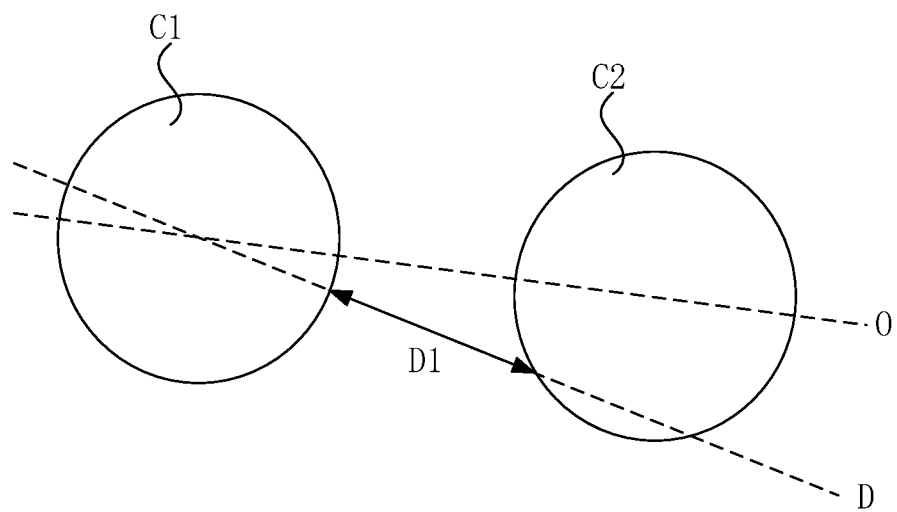
FIG. 2 is another schematic diagram of a method for measuring a shortest distance between adjacent capacitances in a preset arrangement direction in a related art.

However, the inventor finds that the measurement accuracy is relatively high if the capacitances do not have an offset from the preset arrangement direction, and the measurement accuracy is low if the capacitances have an offset from the preset arrangement direction. As illustrated in FIG. 1, a connecting line O of circle centers of the capacitance C1 and the capacitance C2 is in the preset arrangement direction (the direction D), and the capacitances do not have the offset from the preset arrangement direction. At this case, the distance D1 is the shortest distance between the capacitance C1 and the capacitance C2 in the preset arrangement direction. As illustrated in FIG. 2, the connecting line O of the circle centers of the capacitance C1 and the capacitance C2 is not in the preset arrangement direction (the direction D), and the capacitance C2 has an offset from the preset arrangement direction. At this case, the distance D1 is not the shortest distance between the capacitance C1 and the capacitance C2. The distance D1 is greater than the shortest distance between the capacitance C1 and the capacitance C2, and the measurement is inaccurate, resulting in that an error is caused when this distance is used to estimate the probability of the short circuit occurring between the capacitances.

In view of the above reason, the embodiments of the disclosure provide a method for measuring a shortest distance between capacitances in a preset arrangement direction, which can accurately measure the shortest distance between the capacitances in either case that the capacitances have an offset from the preset arrangement direction or the capacitances do not have an offset from the preset arrangement direction, so that estimation accuracy is improved.

The method for measuring the shortest distance between the capacitances in the embodiments of the disclosure includes the following steps. The distance between the tangent lines of the adjacent surfaces of the two adjacent capacitances is obtained, and the distance between the tangent lines of the adjacent surfaces of the two adjacent capacitances is taken as the shortest distance between two capacitances. The tangent lines of the adjacent surfaces of the two adjacent capacitances have a same direction, and the direction of the tangent lines is perpendicular to the preset arrangement direction of the capacitances.

Figure 3:
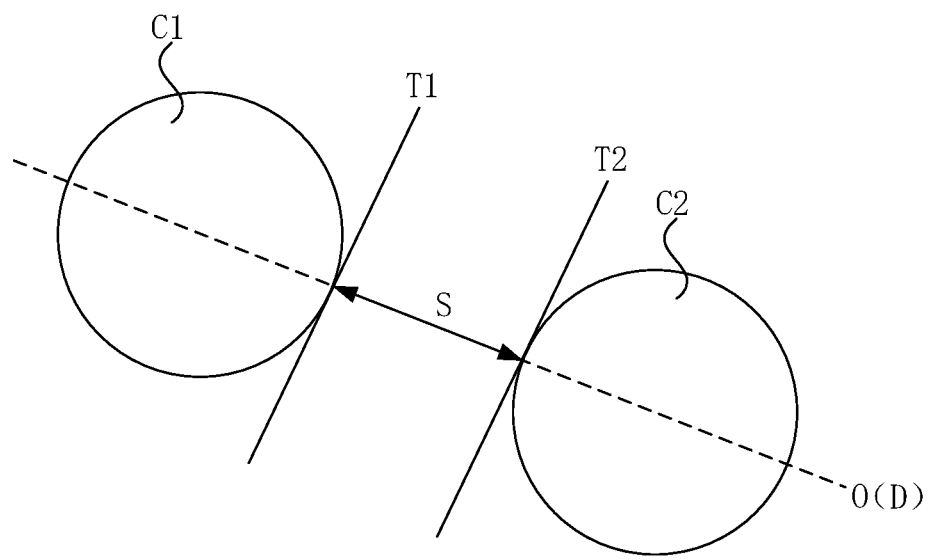
FIG. 3 is a schematic diagram of a method for measuring a shortest distance between capacitances according to an embodiment of the disclosure.

FIG. 3 is a schematic diagram of a method for measuring a shortest distance between capacitances according to an embodiment of the disclosure. Referring to FIG. 3, a capacitance C1 and a capacitance C2 are adjacent. The capacitance C1 and the capacitance C2 have a preset arrangement direction, such as a direction D in FIG. 3. In the present embodiment, the preset arrangement direction is a theoretical arrangement direction of the capacitances. The theoretical arrangement direction refers to a theoretical design direction of the capacitances. The theoretical design direction of the capacitances is a pre-designed before manufacture of a semiconductor structure. In other embodiments, the preset arrangement direction may be any determined target direction.

A distance between a tangent line T1 and a tangent line T2 of adjacent surfaces of the capacitance C1 and the capacitance C2 is obtained, and the distance between the tangent line T1 and the tangent line T2 of the adjacent surfaces of the capacitance C1 and the capacitance C2 is taken as the shortest distance between the capacitance C1 and the capacitance C2 in the preset arrangement direction. The capacitance C1 and the capacitance C2 are columnar capacitances, so that a cross section of each columnar capacitance is circular, and the tangent line T1 and the tangent line T2 are tangent lines of the circular cross sections. The tangent line T1 has a same extending direction as the tangent line T2 and the extending direction is perpendicular to the preset arrangement direction (the direction D) of the capacitance C1 and the capacitance C2. For example, if the preset arrangement direction is a horizontal direction, the extending direction of the tangent line T1 and the tangent line T2 is vertical direction. If the preset arrangement direction is a vertical direction, the extending direction of the tangent line T1 and the tangent line T2 is horizontal direction.

The distance between the tangent lines of the adjacent surfaces of the two adjacent capacitances along the preset arrangement direction is taken as the shortest distance between two capacitances. The distance S between the tangent line T1 and the tangent line T2 of the capacitance C1 and the capacitance C2 along the preset arrangement direction (the direction D) is taken as the shortest distance between the capacitance C1 and the capacitance C2.

The shortest distance obtained by the measurement method of the embodiments of the disclosure will not be affected by whether the capacitances have an offset from the preset arrangement. That is, the measurement method of the embodiments of the disclosure can measure the shortest distance between the capacitances no matter whether the capacitances have an offset from the preset arrangement direction. In case that the capacitances do not have an offset from the preset arrangement direction, as illustrated in FIG. 3, a connecting line of circle centers of the capacitance C1 and the capacitance C2 is in the preset arrangement direction (the direction D), the distance S between the tangent line T1 and the tangent line T2 is the shortest distance between the capacitance C1 and the capacitance C2 in the preset arrangement direction. In case that the capacitances have an offset from the preset arrangement direction, as illustrated in FIG. 4, the connecting line O of the circle centers of the capacitance C1 and the capacitance C2 is not in the preset arrangement direction (the direction D), that is, the capacitance C2 has an offset from the preset arrangement direction, at this case, the distance S between the tangent line T1 and the tangent line T2 is still the shortest distance between the capacitance C1 and the capacitance C2.

The shortest distance obtained by the method of the embodiments of the disclosure can avoid the measurement error caused by the offset of the capacitances from the preset arrangement direction, and improve the measurement accuracy greatly.

Under the influence of a measuring instrument, if the distance between the tangent line T1 and the tangent line T2 of the adjacent surfaces of the capacitance C1 and the capacitance C2 is directly measured, there will be a great error. Therefore, the embodiments of the disclosure provide two methods that can indirectly measure the distance between the tangent line T1 and the tangent line T2 of the adjacent surfaces of the capacitance C1 and the capacitance C2.

Figure 4:
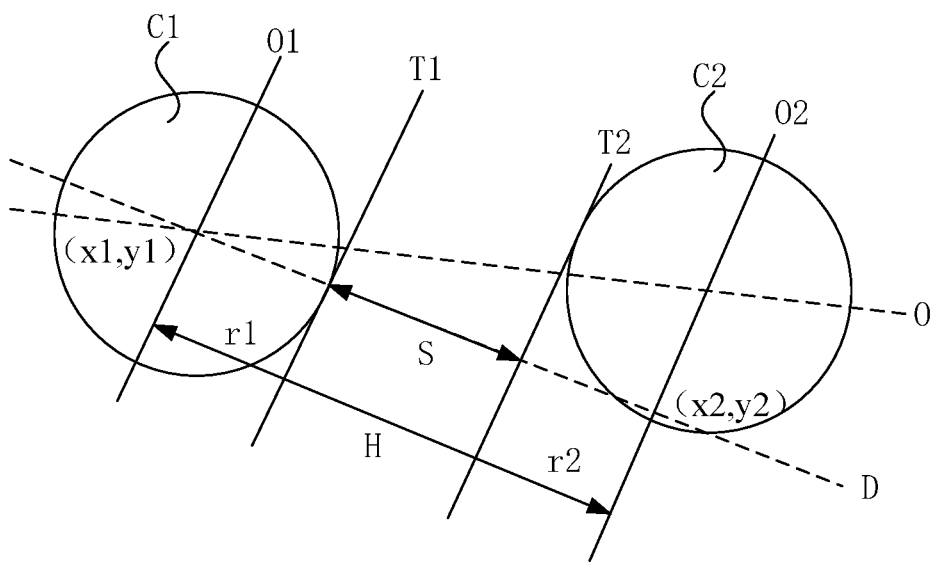
FIG. 4 is another schematic diagram of a method for measuring a shortest distance between capacitances according to an embodiment of the disclosure.

Referring to FIG. 4, one method for measuring the distance between the tangent line T1 and the tangent line T2 of the adjacent surfaces of the capacitance C1 and the capacitance C2 is as follows.

A radius r1 of the capacitance C1 and a radius r2 of the capacitance C2 are obtained. This step may be implemented by a measuring instrument.

A distance H between two straight lines O1 and O2 that pass through the circle centers of the capacitance C1 and the capacitance C2 respectively is obtained. The straight lines O1 and O2 have a same extending direction as the tangent lines T1 and T2. That is, the straight lines O1 and O2 and the tangent lines T1 and T2 are parallel, and the four straight lines are all perpendicular to the preset arrangement direction of the capacitances. For example, if the preset arrangement direction of the capacitances is a horizontal direction, the straight lines O1 and O2 and the tangent lines T1 and T2 are in a vertical direction. In FIG. 4, the preset arrangement direction of the capacitances is in the direction D forming an included angle with the horizontal direction, then the extending direction of the straight lines O1 and O2 and the tangent lines T1 and T2 is perpendicular to the direction D.

Figure 5:
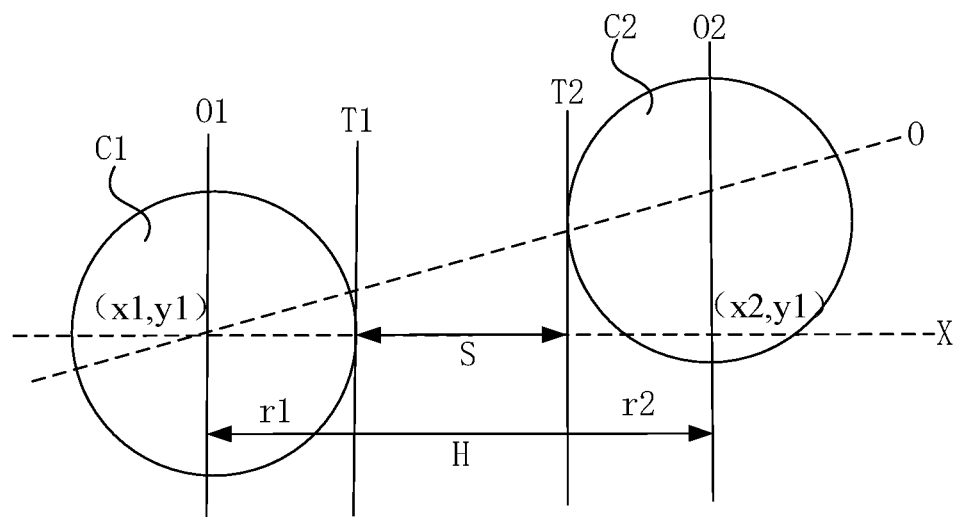
FIG. 5 is another schematic diagram of a method for measuring a shortest distance between capacitances according to an embodiment of the disclosure.

In the present embodiment, the step that a distance between two straight lines that pass through circle centers of the two adjacent capacitances is obtained respectively further includes: a distance between projection coordinate points of the circle centers of the two capacitances in the preset arrangement direction is taken as the distance between the two straight lines that pass through the circle centers of the two adjacent capacitances respectively. Referring to FIG. 4, the projection coordinate of the circle center of the capacitance C1 in the preset arrangement direction (the direction D) is (x1, y1), and the projection coordinate of the circle center of the capacitance C2 in the preset arrangement direction (the direction D) is (x2, y2), the distance between the projection coordinate points of the circle centers of the capacitance C1 and the capacitance C2 in the preset arrangement direction may be calculated by means of the Pythagorean theorem. For another simple example, as illustrated in FIG. 5, when the preset arrangement direction is a horizontal direction (a direction X), the projection coordinates of the capacitance C1 and the capacitance C2 in the preset arrangement direction are (x1, y1) and (x2, y1) respectively, and the y-coordinates are the same and may be ignored, so that the distance between the projection coordinate points is a difference between the x-coordinates x2 and x1.

After the distance H between the two straight lines O1 and O2 that pass through the circle centers of the capacitance C1 and the capacitance C2 respectively is obtained, the distance H between the two straight lines O1 and O2 and a sum of the radiuses r1 and r2 of the two capacitances C1 and C2 are subjected to subtraction, and the difference value is used as the distance S between the tangent lines T1 and T2, S=H−r1−r2. The distance S is the shortest distance between the capacitance C1 and the capacitance C2 in the preset arrangement direction.

Figure 6:
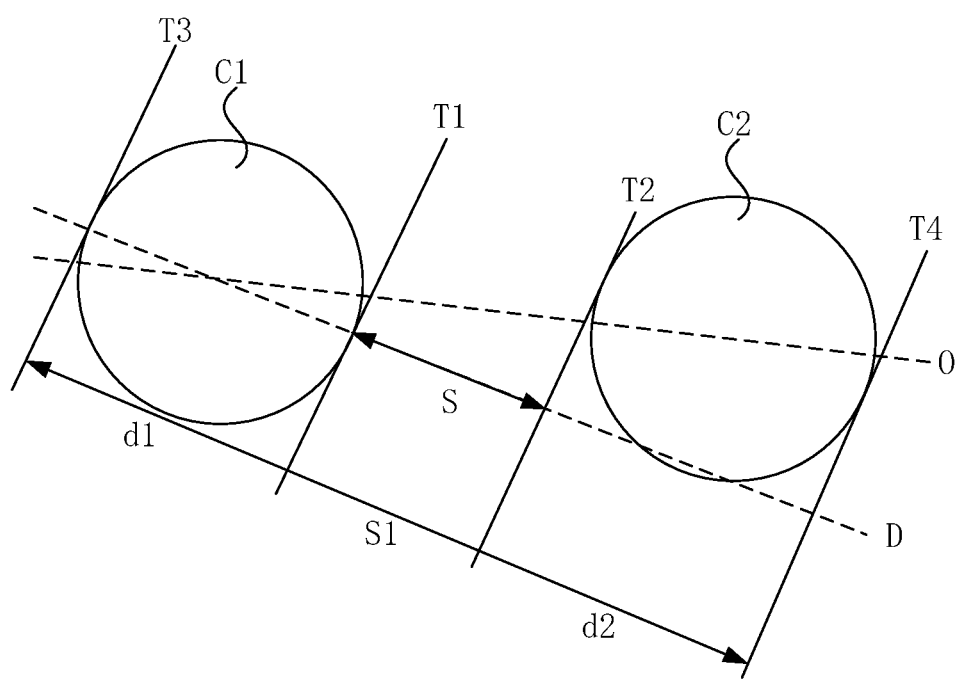
FIG. 6 is a schematic diagram of a method for measuring a shortest distance between capacitances according to another embodiment of the disclosure.

Referring to FIG. 6, another method for measuring the distance between the tangent line T1 and the tangent line T2 of the adjacent surfaces of the capacitance C1 and the capacitance C2 provided by the embodiments of the disclosure is as follows.

A diameter d1 of the capacitance C1 and a diameter d2 of the capacitance C2 are obtained. This step may be implemented by a measuring instrument.

A distance between first tangent lines of non-adjacent surfaces of the capacitance C1 and the capacitance C2 is obtained. The first tangent lines have a same extending direction as the adjacent surfaces of the capacitance C1 and the capacitance C2. The first tangent lines of the non-adjacent surfaces of the capacitance C1 and the capacitance C2 are a tangent line T3 and a tangent line T4 respectively. The tangent line T3 and the tangent line T4 have the same extending direction as the tangent line T1 and the tangent line T2, that is, the tangent line T3 and the tangent line T4 are parallel to the tangent line T1 and the tangent line T2. It should be understood that an orientation of the distance S1 between the tangent line T3 and the tangent line T4 is the same as an orientation of the distance S between the tangent line T1 and the tangent line T2. For example, the distance S1 between the tangent line T3 and the tangent line T4 is the distance between the tangent line T3 and the tangent line T4 along the preset arrangement direction (the direction D).

A difference value of the distance S1 between the tangent line T3 and the tangent line T4 and a sum of the diameters d1 and d2 of the capacitance C1 and the capacitance C2 is obtained. The difference value is the distance S between the tangent line T1 and the tangent line T2, that is, the difference value is the shortest distance between the capacitance C1 and the capacitance C2 in the preset arrangement direction, S=S1−d1−d2.

The embodiments of the disclosure provide the above-mentioned two methods for measuring the distance between the tangent line T1 and the tangent line T2 of the adjacent surfaces of the capacitance C1 and the capacitance C2, and those skilled in the art can also use other methods to measure the distance between the tangent line T1 and the tangent line T2 of the adjacent surfaces of the capacitance C1 and the capacitance C2.

The shortest distance between the adjacent capacitances obtained in the above-mentioned measurement method is usually used to evaluate a capacitance manufacture procedure. Therefore, the embodiments of the disclosure further provide a method for evaluating a capacitance manufacture procedure. The method for evaluating a capacitance manufacture procedure of the embodiments of the disclosure is to obtain a shortest distance between two capacitances and compare the shortest distance between the two capacitances with a preset value to evaluate the capacitance manufacture procedure.

The shortest distance between two capacitances is obtained by the above-mentioned measurement method. The preset value is a distance between the tangent lines when the capacitances are arranged according to a preset arrangement direction. The preset value is a designed value during design of a semiconductor device. For example, referring to FIG. 3, the preset value is the distance between the tangent line T1 and the tangent line T2 when the capacitances C1 and C2 are arranged according to the preset arrangement direction and do not have an offset. The distance may be a distance along the preset arrangement direction of the capacitances.

In some embodiments, evaluating the capacitance manufacture procedure includes evaluating a probability of a short circuit between capacitances and evaluating a capacitance opening degree.

When the shortest distance between the two capacitances is less than the preset value, the shortest distance may be used to evaluate the probability of the short circuit between the capacitances, so that the quality of the manufacture procedure and the influence on yield can be determined. For example, a deviation from the shortest distance between the two capacitances to the preset value is in direct proportion to the probability of the short circuit occurring between the capacitances. If the deviation from the shortest distance between the two capacitances to the preset value is larger, the probability of the short circuit occurring between the capacitances is greater.

When the shortest distance between the two capacitances is greater than the preset value, the shortest distance may be used to evaluate the capacitance opening degree. For example, the deviation from the shortest distance between the two capacitances to the preset value is in direct proportion to the capacitance opening degree. If the deviation from the shortest distance between the two capacitances to the preset value is larger, the capacitance opening degree is greater.

Figure 7:
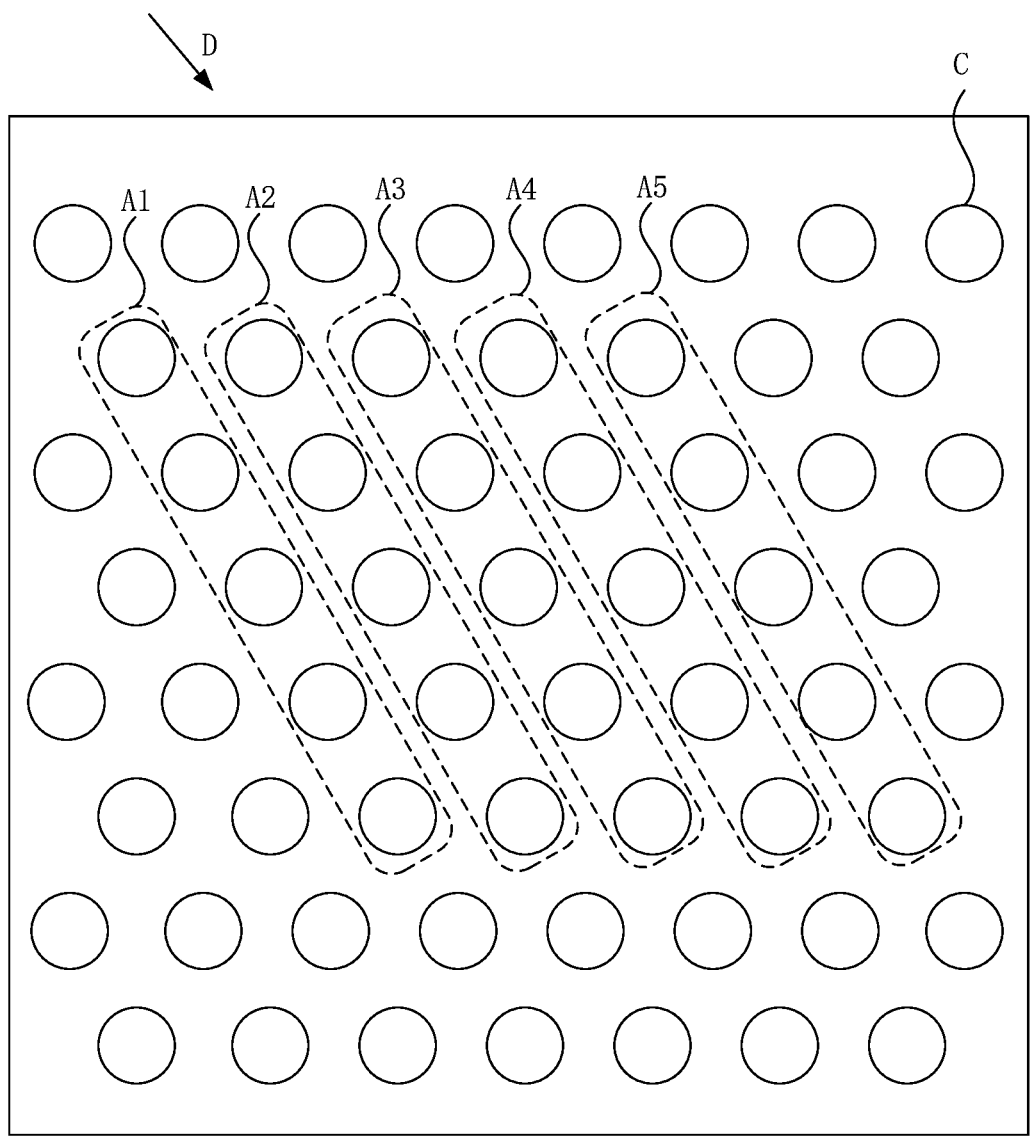
FIG. 7 is a schematic diagram of a method for evaluating a capacitance manufacture procedure according to an embodiment of the disclosure.

The embodiments of the disclosure further provide a method for evaluating a capacitance manufacture procedure. The method for evaluating a capacitance manufacture procedure of the embodiments of the disclosure is described below in combination with FIG. 7. Referring to FIG. 7, a semiconductor device includes multiple capacitances C.

In step I, multiple sampling regions are set. For example, sampling regions A1, A2, A3, A4, and A5 are set. The multiple sampling regions may be orderly or disorderly arranged. In the present embodiment, the sampling regions are orderly arranged.

In step II, in each sampling region, multiple capacitances are obtained along a preset arrangement direction (a direction D) as one capacitance group. Multiple capacitance groups may be obtained from the multiple sampling regions. The multiple capacitance groups are orderly or disorderly disposed. In the present embodiment, the multiple capacitance groups are orderly disposed and are sequentially arranged in a direction forming a preset angle with the preset arrangement direction (the direction D). In FIG. 7, the arrangement modes of the capacitances in the various capacitance groups are the same. In other embodiments, the arrangement modes of the capacitances in the various capacitance groups may also be different. In FIG. 7, the arrangement mode of the capacitances in each capacitance group is ordered. In other embodiments, the arrangement mode of the capacitances in each capacitance group may also be disordered.

For example, in the present embodiment, 5 capacitances are selected from the sampling region A1 along the preset arrangement direction (the direction D) as a first capacitance group; 5 capacitances are selected from the sampling region A2 along the preset arrangement direction (the direction D) as a second capacitance group; 5 capacitances are selected from the sampling region A3 along the preset arrangement direction (the direction D) as a third capacitance group; 5 capacitances are selected from the sampling region A4 along the preset arrangement direction (the direction D) as a fourth capacitance group; and 5 capacitances are selected from the sampling region A5 along the preset arrangement direction (the direction D) as a fifth capacitance group. It should be understood that in other embodiments, the quantity of the capacitances in each capacitance group may also be other quantities.

In step III, a difference between a maximum value and a minimum value of the shortest distances between adjacent capacitances in each capacitance group is obtained as an initial parameter. The shortest distances between the adjacent capacitances in each capacitance group are obtained by the above-mentioned measurement method.

In step IV, a mean value of the initial parameters of the multiple capacitance groups is obtained. The mean value is used as a parameter for evaluating the capacitance manufacture procedure.

For example, the shortest distances between the adjacent capacitances in the first capacitance group are $S1.1$, $S1.2$, $S1.3$, $S1.4$, and $S1.5$ respectively; the shortest distances between the adjacent capacitances in the second capacitance group are $S2.1$, $S2.2$, $S2.3$, $S2.4$ and $S2.5$ respectively; the shortest distances between the adjacent capacitances in the third capacitance group are $S3.1$, $S3.2$, $S3.3$, $S3.4$ and $S3.5$ respectively; the shortest distances between the adjacent capacitances in the fourth capacitance group are $S4.1$, $S4.2$, $S4.3$, $S4.4$ and $S4.5$ respectively; and the shortest distances between the adjacent capacitances in the fifth capacitance group are $S5.1$, $S5.2$, $S5.3$, $S5.4$ and $S5.5$ respectively.

The mean value is: P=Average ((Max($S1.1$; $S1.2$; $S1.3$; $S1.4$; $S1.5$)−Min($S1.1$; $S1.2$; $S1.3$; $S1.4$; $S1.5$))+(Max($S2.1$; $S2.2$; $S2.3$; $S2.4$; $S2.5$)−Min($S2.1$; $S2.2$; $S2.3$; $S2.4$; $S2.5$))+ (Max($S3.1$; $S3.2$; $S3.3$; $S3.4$; $S3.5$)−Min($S3.1$; $S3.2$; $S3.3$; $S3.3$; $S3.4$; $S3.5$))+(Max($S4.1$; $S4.2$; $S4.3$; $S4.4$; $S4.5$)−Min($S4.1$; $S4.2$; $S4.3$; $S4.4$; $S4.5$))+(Max($S5.1$; $S5.2$; $S5.3$; $S5.4$; $S5.5$)−Min($S5.1$; $S5.2$; $S5.3$; $S5.4$; $S5.5$))), where Max(;; . . . ) represents operation of taking the maximum value, Min(;; . . . ) represents operation of taking the minimum value, and Average(;; . . . ) represents operation of averaging.

The mean value P can be used to evaluate the probability of a short circuit between adjacent capacitances. A smaller mean value P indicates uniform distribution of the capacitances, so that the manufacture procedure is stable, the probability of an offset occurred is lower, and the probability of a short circuit occurred between adjacent capacitances is lower. A larger mean value P indicates disordered capacitance distribution, so that the offsets and short circuits are prone to occur, the yield is reduced, and the manufacture procedure needs to be optimized.

In some embodiments, the accuracy of evaluation can be improved by reasonably selecting the sampling regions and calculation methods.

The above descriptions are only exemplary implementations of the embodiments of the disclosure. It should be understood that those of ordinary skilled in the art can also make several improvements and modifications without departing from the principle of the embodiments of the disclosure. These improvements and modifications shall also be regarded as falling within the protection scope of the embodiments of the disclosure.

The invention claimed is:

1. A method for measuring a shortest distance between two adjacent capacitances, comprising: obtaining a distance between tangent lines of adjacent surfaces of the two adjacent capacitances, and taking the distance between the tangent lines of the adjacent surfaces of the two adjacent capacitances as the shortest distance between the two adjacent capacitances, wherein the tangent lines of the adjacent surfaces of the two adjacent capacitances have a same direction, and the direction of the tangent lines is perpendicular to a preset arrangement direction of the two adjacent capacitances;

wherein a distance between the tangent lines of the adjacent surfaces of the two adjacent capacitances in the preset arrangement direction is used as the shortest distance between the two adjacent capacitances, the two adjacent capacitances are columnar capacitances, and the tangent lines are tangent lines of cross sections of the two adjacent capacitances;

wherein obtaining the distance between the tangent lines of the adjacent surfaces of the two adjacent capacitances further comprises:

obtaining radiuses of the two adjacent capacitances; obtaining a distance between two straight lines that pass through circle centers of the two adjacent capacitances respectively, wherein the two straight lines have a same extending direction as the tangent lines; and taking a difference of the distance between the two straight lines and a sum of the radiuses of the two adjacent capacitances as the distance between the tangent lines;

or obtaining diameters of the two adjacent capacitances; obtaining a distance between first tangent lines of non-adjacent surfaces of the two adjacent capacitances, the first tangent lines have a same extending direction as the tangent lines of the adjacent surfaces of the two adjacent capacitances; and obtaining a difference value of the distance between the first tangent lines and a sum of the diameters of the two adjacent capacitances, the difference value being taken as the shortest distance between the two adjacent capacitances.

2. The method for measuring the shortest distance between the two adjacent capacitances of claim 1, wherein obtaining the distance between the two straight lines that pass through the circle centers of the two adjacent capacitances respectively further comprises: taking a distance between projection coordinate points of the circle centers of the two adjacent capacitances in the preset arrangement direction as the distance between the two straight lines that pass through the circle centers of the two adjacent capacitances respectively.

3. A method for evaluating a capacitance manufacture procedure, comprising: obtaining a shortest distance between two adjacent capacitances and evaluating the capacitance manufacture procedure by comparing the shortest distance with a preset value, wherein obtaining the shortest distance between the two adjacent capacitances comprises:

obtaining a distance between tangent lines of adjacent surfaces of the two adjacent capacitances, and taking the distance between the tangent lines of the adjacent surfaces of the two adjacent capacitances as the shortest distance between the two adjacent capacitances, wherein the tangent lines of the adjacent surfaces of the two adjacent capacitances have a same direction, and the direction of the tangent lines is perpendicular to a preset arrangement direction of the two adjacent capacitances;

wherein the preset value is a distance between the tangent lines when the two adjacent capacitances are arranged according to the preset arrangement direction, a distance between the tangent lines of the adjacent surfaces of the two adjacent capacitances in the preset arrangement direction is used as the shortest distance between the two adjacent capacitances, the two adjacent capacitances are columnar capacitances, and the tangent lines are tangent lines of cross sections of the two adjacent capacitances;

wherein obtaining the distance between the tangent lines of the adjacent surfaces of the two adjacent capacitances further comprises:

obtaining radiuses of the two adjacent capacitances; obtaining a distance between two straight lines that pass through circle centers of the two adjacent capacitances respectively, wherein the two straight lines have a same extending direction as the tangent lines; and taking a difference of the distance between the two straight lines and a sum of the radiuses of the two adjacent capacitances as the distance between the tangent lines;

or obtaining diameters of the two adjacent capacitances; obtaining a distance between first tangent lines of non-adjacent surfaces of the two adjacent capacitances, the first tangent lines have a same extending direction as the tangent lines of the adjacent surfaces of the two adjacent capacitances; and obtaining a difference value of the distance between the first tangent lines and a sum of the diameters of the two adjacent capacitances, the difference value being taken as the shortest distance between the two adjacent capacitances.

4. The method for evaluating a capacitance manufacture procedure of claim 3, wherein obtaining the distance between the two straight lines that pass through the circle centers of the two adjacent capacitances respectively further comprises:

taking a distance between projection coordinate points of the circle centers of the two adjacent capacitances in the preset arrangement direction as the distance between the two straight lines that pass through the circle centers of the two adjacent capacitances respectively.

5. A method for evaluating a capacitance manufacture procedure, comprising:

setting a plurality of sampling regions;

obtaining a plurality of capacitance groups by obtaining a plurality of capacitances in each sampling region of the plurality of sampling regions along a preset arrangement direction as one capacitance group;

obtaining a difference between a maximum value and a minimum value of shortest distances between adjacent capacitances in each capacitance group of the plurality of capacitance groups as an initial parameter, wherein each of the shortest distances between the adjacent capacitances in each capacitance group is obtained by: obtaining a distance between tangent lines of adjacent surfaces of two adjacent capacitances in the capacitance group, and taking the distance between the tangent lines of the adjacent surfaces of the two adjacent capacitances in the capacitance group as a shortest distance between the two adjacent capacitances in the capacitance group, wherein the tangent lines of the adjacent surfaces of the two adjacent capacitances in the capacitance group have a same direction, and the direction of the tangent lines is perpendicular to the preset arrangement direction of the two adjacent capacitances in the capacitance group; and obtaining a mean value of the initial parameters of the plurality of capacitance groups, the mean value being used as a parameter for evaluating the capacitance manufacture procedure.

6. The method for evaluating the capacitance manufacture procedure of claim 5, wherein a distance between the tangent lines of the adjacent surfaces of the two adjacent capacitances in the preset arrangement direction is used as the shortest distance between the two adjacent capacitances.

7. The method for evaluating the capacitance manufacture procedure of claim 6, wherein the two adjacent capacitances are columnar capacitances, and the tangent lines are tangent lines of cross sections of the two adjacent capacitances.

8. The method for evaluating the capacitance manufacture procedure of claim 7, wherein obtaining the distance between the tangent lines of the adjacent surfaces of the two adjacent capacitances further comprises:

obtaining radiuses of the two adjacent capacitances;

obtaining a distance between two straight lines that pass through circle centers of the two adjacent capacitances respectively, wherein the two straight lines have a same extending direction as the tangent lines; and taking a difference of the distance between the two straight lines and a sum of the radiuses of the two adjacent capacitances as the distance between the tangent lines.

9. The method for evaluating the capacitance manufacture procedure of claim 8, wherein obtaining the distance between the two straight lines that pass through the circle centers of the two adjacent capacitances respectively further comprises: taking a distance between projection coordinate points of the circle centers of the two adjacent capacitances in the preset arrangement direction as the distance between the two straight lines that pass through the circle centers of the two adjacent capacitances respectively.

10. The method for evaluating the capacitance manufacture procedure of claim 7, wherein obtaining the distance between the tangent lines of the adjacent surfaces of the two adjacent capacitances further comprises:
   obtaining diameters of the two adjacent capacitances;
   obtaining a distance between first tangent lines of non-adjacent surfaces of the two adjacent capacitances, the first tangent lines have a same extending direction as the tangent lines of the adjacent surfaces of the two adjacent capacitances; and
   obtaining a difference value of the distance between the first tangent lines and a sum of the diameters of the two adjacent capacitances, the difference value being taken as the shortest distance between the two adjacent capacitances.

11. The method for evaluating the capacitance manufacture procedure of claim 5, further comprising:
   disposing the plurality of capacitance groups orderly or disorderly.

12. The method for evaluating the capacitance manufacture procedure of claim 11, wherein the plurality of capacitance groups are disposed orderly or disorderly by arranging the plurality of capacitance groups sequentially in a direction forming a preset angle with the preset arrangement direction.

\* \* \* \* \*